United States Patent
Bell, Jr. et al.

(10) Patent No.: US 7,686,619 B2
(45) Date of Patent: Mar. 30, 2010

(54) APPARATUS, SYSTEM, AND METHOD FOR A CONFIGURABLE BLADE CARD

(75) Inventors: Robert H. Bell, Jr., Austin, TX (US); Jose R. Escalera, Austin, TX (US); Octavian F. Herescu, Austin, TX (US); Vernon W. Miller, Tucson, AZ (US); Michael D. Roll, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/016,043

(22) Filed: Jan. 17, 2008

(65) Prior Publication Data

US 2009/0186494 A1    Jul. 23, 2009

(51) Int. Cl.
*H01R 12/00* (2006.01)
(52) U.S. Cl. .................................. 439/65; 439/631
(58) Field of Classification Search ............... 439/61, 439/62, 65, 631; 361/728–732, 735–736
See application file for complete search history.

(56) References Cited

U.S. PATENT DOCUMENTS

| | | | |
|---|---|---|---|
| 4,938,701 A * | 7/1990 | Heberling .................... 439/65 |
| 5,808,863 A | 9/1998 | Radloff et al. |
| 6,819,567 B2 | 11/2004 | Baker et al. .................. 361/724 |
| 6,904,482 B2 | 6/2005 | Rietze et al. ................. 710/107 |
| 6,935,868 B1 * | 8/2005 | Campini et al. ............... 439/67 |
| 7,079,381 B2 | 7/2006 | Brehm et al. |
| 7,102,893 B1 | 9/2006 | MacArthur et al. ......... 361/788 |
| 7,113,401 B2 | 9/2006 | Becker et al. |
| 7,184,395 B2 | 2/2007 | Birmingham ............... 370/222 |
| 7,234,964 B1 | 6/2007 | Karstens ..................... 439/490 |
| 2002/0118587 A1 | 8/2002 | Otori et al. |
| 2002/0131245 A1 | 9/2002 | Clayton et al. |
| 2004/0109297 A1 | 6/2004 | Kim et al. |
| 2006/0087824 A1 | 4/2006 | Sandy et al. ................. 361/796 |
| 2006/0203460 A1 | 9/2006 | Aviv |
| 2006/0285289 A1 | 12/2006 | Jones et al. |
| 2007/0030678 A1 | 2/2007 | Bedson et al. |

\* cited by examiner

*Primary Examiner*—Khiem Nguyen
(74) *Attorney, Agent, or Firm*—Kunzler & McKenzie

(57) ABSTRACT

An apparatus, system, and method are disclosed for a configurable blade card. A base card is in physical and electrical communication with a blade connector. The blade connector is in physical and electrical communication with a blade enclosure connector. A secondary card is in physical and electrical communication with the base card to form a blade card. A coupler physically couples the base card and the secondary card. The base card and the secondary card are co-planar and compatible with a blade card form factor.

20 Claims, 6 Drawing Sheets

APPARATUS, SYSTEM, AND METHOD FOR A CONFIGURABLE BLADE CARD

BACKGROUND OF THE INVENTION

1. Field of the Invention

This invention relates to blade cards and more particularly relates to configurable blade cards.

2. Description of the Related Art

Blade systems are increasingly used to provide data processing services. A blade system includes a blade enclosure. The blade enclosure receives a plurality of blade cards. The blade cards typically connect to the blade enclosure through a blade enclosure connector. The blade enclosure connector may hold a blade card in place with the blade enclosure. In addition, the blade enclosure connector provides electrical communication between the blade card and the blade enclosure.

The blade enclosure may connect the blade cards to communication resources such as a wide area network (WAN), a local area network (LAN), the Internet, and the like. In addition, the blade enclosure may connect the blade cards to storage resources such as a storage area network (SAN). The blade enclosure may also provide power and cooling for the blade cards.

A blade card may be configured as a server, a storage device, a communication device, and the like. For example, a blade enclosure may include twelve blade server cards that each function as a multiprocessor server. An administrator may easily add a server to a data processing system by adding a blade server card to a blade enclosure.

A blade card may include one or more processors, a plurality of memories in various configurations, a storage device, and the like. Administrators may require a variety of blade card configurations. For example, an administrator may require both a single processor blade server card with a hard disk drive and a single processor blade server card without a hard disk drive. Unfortunately, providing a wide variety of blade server card configurations can be expensive.

SUMMARY OF THE INVENTION

From the foregoing discussion, there is a need for an apparatus, system, and method for configurabling a blade card. Beneficially, such an apparatus, system, and method would configure the blade card to provide a wide variety of cost-effective blade server card configurations.

The present invention has been developed in response to the present state of the art, and in particular, in response to the problems and needs in the art that have not yet been fully solved by currently available blade systems. Accordingly, the present invention has been developed to provide an apparatus, system, and method for a configurable blade card that overcome many or all of the above-discussed shortcomings in the art.

The apparatus to configure a blade card is provided with a plurality of elements configured to functionally execute the steps of connecting a base card, connecting a secondary card, and physically coupling the base card and the secondary card. These modules in the described embodiments include a blade connector, a base card, a secondary card, and a coupler.

The base card is in physical and electrical communication with the blade connector. The blade connector is in physical and electrical communication with a blade enclosure connector.

The secondary card is in physical and electrical communication with the base card to form the blade card. The base card and the secondary card are co-planar and compatible with a blade card form factor. The coupler physically couples the base card and the secondary card.

A system of the present invention is also presented to configure a blade card. In particular, the system, in one embodiment, includes a blade enclosure, a blade connector, a base card, a secondary card, and a coupler.

The blade enclosure comprises a plurality of blade enclosure connectors. The blade enclosure is configured to receive blade cards compatible with a blade card form factor. The blade connector is in physical and electrical communication with a first blade enclosure connector. The base card is in physical and electrical communication with the blade connector. The secondary card is in physical and electrical communication with the base card to form the blade. In particular, the base card and the secondary card are co-planar and compatible with the blade card form factor. The coupler physically couples the base card and the secondary card.

A blade card configuration method of the present invention is also presented. The method in the disclosed embodiments substantially includes the steps to carry out the functions presented above with respect to the operation of the described apparatus and system. In one embodiment, the method includes connecting a base card, connecting a secondary card, and physically coupling the base card and the secondary card.

A base card connects to a blade connector. The base card is in physical and electrical communication with the blade connector. The blade connector is in physical and electrical communication with a blade enclosure connector.

A secondary card connects to the base card. The secondary card is in physical and electrical communication with the base card to form the blade card. In particular, the base card and the secondary card are co-planar and compatible with a blade card form factor. A coupler physically couples the base card and the secondary card.

References throughout this specification to features, advantages, or similar language do not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The present invention provides an apparatus, a system, and a method for a configurable blade card. Beneficially, such an apparatus, a system, and a method would configure blade cards to provide a variety of desired configurations without the need to design, build, and stock a blade card for each unique configuration. The configured blade card may provide a wide variety of less expensive blade server card configurations that may be used to provide data processing services. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
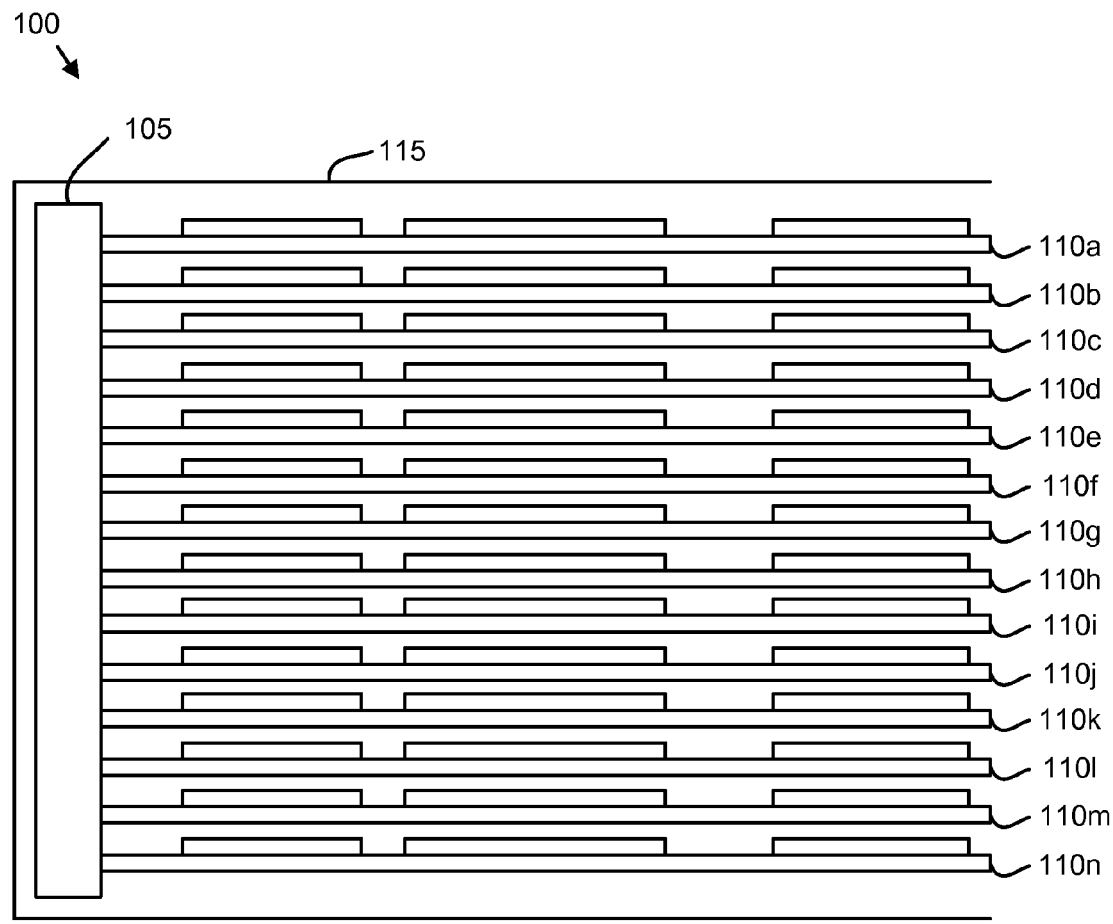
FIG. 1 is a top view schematic drawing illustrating one embodiment of a blade system in accordance with the present invention.

FIG. 1 is a top view schematic drawing illustrating one embodiment of a blade system 100 in accordance with the present invention. The blade system 100 includes a blade enclosure connector 105, a blade enclosure 115, and a plurality of blade cards 110a-n. Although, for simplicity, the blade system 100 is shown with one (1) blade enclosure connector 105, one (1) blade enclosure 115, and fourteen (14) blade cards 110a-n, any number of blade enclosure connectors 105, blade enclosures 115, and blade cards 110 maybe employed in the blade system 100.

The blade enclosure 115 comprises a plurality of blade enclosure connectors 105. The blade enclosure connector 105 is shown as a single unit, although the blade enclosure connector 105 may be configured as the plurality of blade enclosure connectors 105.

The blade enclosure 115 may provide one or more services including supplying power to various interconnects, cooling the blade cards 110a-n, networking one or more of the blade cards 110a-n to one or more communication resources such as a WAN, a LAN, the Internet, and/or the like, connecting one or more of the blade cards 110a-n to other interconnects such as a SAN and/or the like, management of the blade cards 110a-n, and the like. A rack may hold one or more blade enclosures 115. The rack may have standard dimensions such as, a width of forty eight point three centimeters (48.3 cm), a depth of eighty eight point nine centimeters (88.9 cm), and a height of 1U rack, 2U rack, 4U half-rack, or the like. The "U" may refer to one rack unit and may be equal to four point four four five centimeters (4.445 cm).

The blade enclosure 115 may include a front encasement and a rear encasement (not shown). The front encasement of the blade enclosure 115 may include a plurality of device bays, power supply bays, air intake slots, and/or the like. The plurality of device bays may receive the plurality of blade cards 110a-n. The plurality of power supply bays may provide power to various interconnects and/or components. The plurality of air intake slots may allow cross ventilation of air for cooling the plurality of blade cards 110a-n and other components. The plurality of device bays, power supply bays, air intake slots may be configured as is well known to those skilled in the art.

The blade enclosure 115 is configured to receive blade cards 110a-n compatible with a blade card form factor. In a particular example, if the blade enclosure 115 is to receive fourteen (14) blade cards 110a-n and each blade card 110a-n has the blade card form factor such as a height of thirty six point six three centimeters (36.63 cm), a depth of forty eight point five one centimeters (48.51 cm), and a width of five point one four centimeters (5.14 cm) the blade enclosure 115 may be configured to receive the blade cards 110a-n and may have the dimensions such as a height of 9U, a depth of eighty eight point nine centimeters (88.9 cm), and a width of forty eight point three centimeters (48.3 cm). An administrator may install the plurality of blade cards 110a-n from the front encasement of the blade enclosure 115 as is well known to those skilled in the art.

The plurality of blade enclosure connectors 105 may be configured in the rear encasement of the blade enclosure 115. The rear encasement of the blade enclosure 115 may include a plurality of device interconnect bays, fan bays, onboard administrator bays, and the like. The plurality of device interconnect bays may be referred as a plurality of I/O bays and further may be configured as the plurality of blade enclosure connectors 105. The blade enclosure connector 105 for example, may include a Fibre-Channel interconnect module, an Ethernet interconnect module, a Serially Attached Small Computer System Interface (SCSI), and the like. In a particular example, the blade enclosure 115 may provide connections for a plurality of high speed I/O bays using one or more ten gigabit (10 Gb) Ethernet Expansion cards, four gigabit (4 Gb) SAN Switches, Fabric Switches, internet SCSI Expansion Card mezzanine cards, host bus adapters, or the like. With the dual-port ten gigabit (10 Gb) Ethernet Expansion card, a maximum of two (2) ten gigabit (10 Gb) Ethernet switches may reside in the I/O bays of the blade enclosure 115. The Ethernet switches may connect to the blade cards 110a-n via a dual-port ten gigabit (10 Gb) Ethernet I/O card installed on the blade card 110.

The Ethernet switch may supply six (6) external ten gigabit (10 Gb) small form factor pluggable interfaces in the form of optical transceivers for outside communication and one (1) ten gigabit (10 Gb) Ethernet RJ-45 port for management and control. A management module (not shown) may manage the ten gigabit (10 Gb) Ethernet switch via two (2) internal one hundred megabit per second (100 Mbps) ports for communication.

A blade card 110a-n may be configured as a server, a storage device, a communication device, and the like. For example, a blade enclosure 115 may include fourteen (14) blade server cards 110a-n, and each one of those may function as a multiprocessor server. The administrator may easily add the server to the data processing system by adding the blade card 110 to the blade enclosure 115.

Each blade card 110a-n may include a front bezel and a rear panel. The front bezel may comprise a plurality of air vents, a serial universal video (SUV) port, a blade extraction lever, and the like. The plurality of air vents may provide cross ventilation of air for cooling. The SUV port may receive a SUV cable to attach other peripherals such as a monitor, a keyboard, and the like. The SUV port may allow communication between the administrator and the blade system 100. The blade extraction lever may allow proper installation of each blade card 110a-n. The plurality of air vents, SUV port, and blade extraction levers may be configured as is well known to those skilled in the art.

Each blade card 110a-n may include a plurality of SCSI connectors, a plurality of processors, a system board, a plurality of Synchronous Dynamic Random Access Memory (SDRAM), and the like. The system board may comprise a plurality of sockets to receive the plurality of peripherals. For example, the system board may comprise the plurality of sockets to receive the plurality of processors.

The rear panel of each blade card 110 may comprise a plurality blade connectors, a plurality of power connectors and the like. The plurality of power connectors may be the like known to those skilled in the art.

Figure 2:
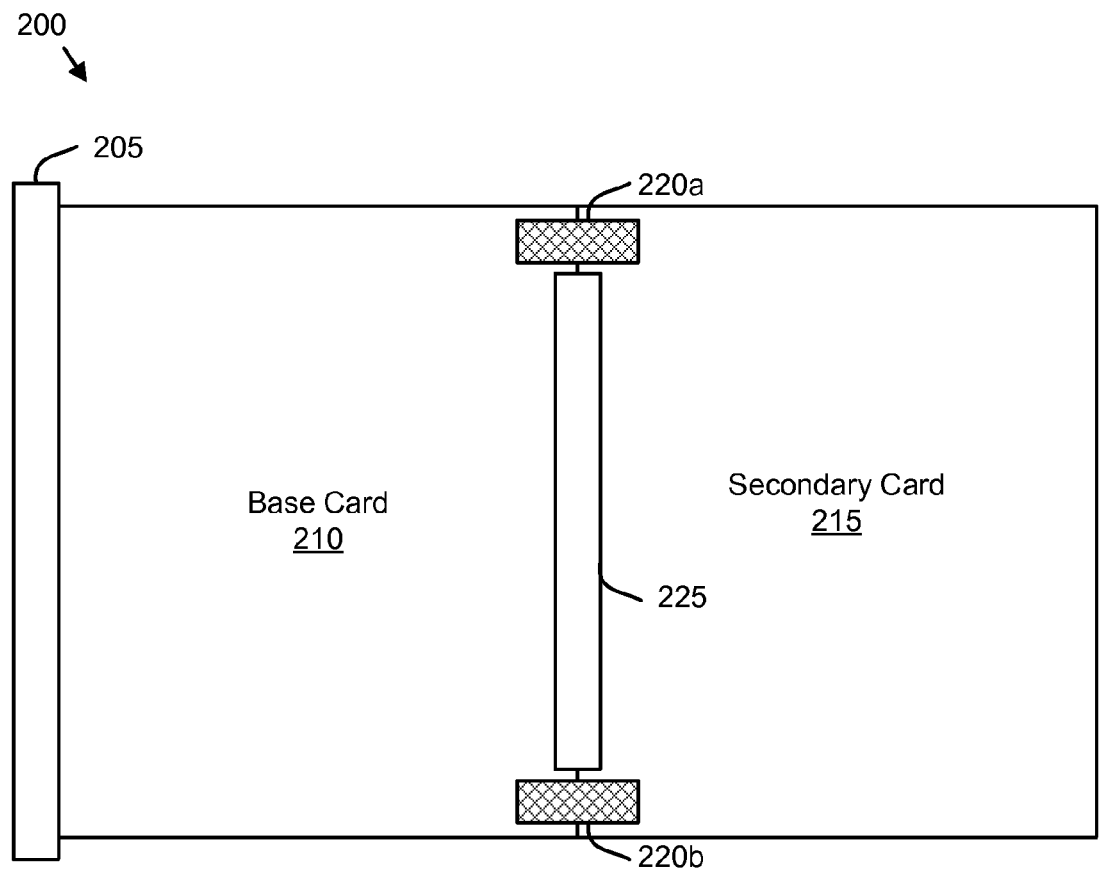
FIG. 2 is a schematic block diagram illustrating one embodiment of a blade card of the present invention.

FIG. 2 is a schematic block diagram illustrating one embodiment of a blade card 200 of the present invention. The blade card 200 may be embodied in the blade system 100 of FIG. 1. The description of the blade card 200 refers to elements of FIG. 1, like numbers referring to like elements. The blade card 200 includes a blade connector 205, a base card 210, a secondary card 215, a plurality of couplers 220a-b, and a pin connector 225. Although, for simplicity, the blade card 200 is shown with one (1) blade connector 205, one (1) base card 210, one (1) secondary card 215, two (2) couplers 220a-b and one (1) pin connector 225, any number of those may be employed in the blade card 200.

The blade connector 205 is in physical and electrical communication with a first blade enclosure connector 105. The base card 210 is in physical and electrical communication with the blade connector 205. The secondary card 215 is in physical and electrical communication with the base card 210 to form the blade card 200, wherein the base card 210 and the secondary card 215 are co-planar and compatible with a blade card form factor.

International organizations and industry have adopted standards that may define the physical size and shape of the blade card 200 to support compatibility between different manufacturers. For example, a set of standards for the blade card 200 such as the Standard Form-factor (SFF), Thin Form-factor (TFF), or the like may define the physical size and shape for the SFF, TFF blade card 200.

The first blade enclosure connector 105 may be the blade enclosure connector 105 of blade system 100. The blade connector 205 for example may be a GbX® signal connector produced by Amphenol Corporation of Wallingford, Conn. or the like.

The pin connector 225 may connect the base card 210 and the secondary card 215. For example, the system board of the secondary card 215 may be attached to a special port or a connector on the systemboard of the base card 210. In a particular example, the secondary card 215 may attach to the base card 210 using the pin connector 225. The pin connector 225 may be configured as a male plug having a plurality of pins configured on the base card 210 and a female socket having a plurality receiving ends configured on the secondary card 215 for the plurality of pins. The pin connector 225 may provide physical and electrical communication between the base card 210 and the secondary card 215. The pin connector 225 may also provide routing for signals between the base card 210 and the secondary card 215.

In an embodiment, the base card 210 and the secondary card 215 collectively comprise at least one (1) processor, at least one (1) storage device, and at least one (1) I/O device. For example, the base card 210 and the secondary card 215 may collectively comprise at least one (1) processor such as ITANIUM®, PENTIUM® VI, or the like, at least one (1) storage device such as a hard disk, an optical storage devices, a micromechanical storage device, a holographic storage device, a semiconductor storage device, or the like, and at least one (1) I/O device such as a built in I/O card, a ten gigabit (10 Gb) Ethernet Expansion card, or the like. The processor may also include for example, a front side bus, a volatile memory, a cache memory, an I/O controller, a system clock generation, an Inter-Integrated Circuit (12C) circuitry for manageability and fault detection, and the like. The volatile memory may include a random access memory (RAM), a static random access memory (SRAM), dual in-line memory module (DIMM), a dynamic random access memory (DDRAM), or the like. The base card 210 and the secondary card 215 may also collectively comprise a serially attached SCSI (SAS) backplane, a power system, and the like. The SAS disk backplane may support a plurality of small form factor (SFF) hot-plugging hard disk drives. The base card 210 and the secondary card 215 may collectively receive a bulk direct current (DC) voltage from the blade enclosure 115. The bulk DC voltage for example, of twelve volts (12V) may be converted to the required DC voltages and may pass through an E-Fuse circuitry. The twelve volts (12V) DC may then be distributed to various point-of-load (POL) converters. The E-Fuse circuitry and the POL converters may be the like known to those skilled in the art.

In an embodiment, the base card 210 and the secondary card 215 are configured as a blade server. For example, the base card 210 and the secondary card 215 may be configured as the blade server that may provide more processing power in less rack space, simplifying cabling, and reducing power consumption. Additionally, the base card 210 and the secondary card 215 configured as the blade server may connect to a storage pool facilitated by a network-attached storage (NAS), a Fiber Channel, and/or an iSCSI, a SAN, or the like for additional storage. The base card 210 and the secondary card 215 configured as the blade server may also be used in clustering servers that are dedicated to a single task, such as file sharing, web page serving and caching, load sharing and failover capabilities, and/or the like.

The secondary card 215 may be in physical and electrical communication with the blade connector 205. For example, the secondary card 215 configured as the processor that may communicate physically and electrically with the blade connector 205 configured as a GbX® signal connector. The GbX® signal connector may thus link the secondary card 215 configured as the processor to the SAN.

The plurality of couplers 220a-b may provide stability to the blade card 200. Additionally, the plurality of couplers 220a-b may align the base card 210 and the secondary card 215 in the same plane.

The coupler 220 physically couples the base card 210 and the secondary card 215. The coupler 220 may be configured as a clamp. Alternatively, in an embodiment, the coupler 220 is configured as a notch and flange as will be shown hereafter.

The coupler 220 may electrically connect the base card 210 and the secondary card 215. For example, the coupler 220 may electrically connect the base card 210 configured as the processor and the secondary card 215 configured as the hard disk to the E-Fuse circuitry and/or POL.

In an embodiment, the coupler 220 consists of a wire connector. Alternatively, the coupler 220 may consist of a solder joint. The wire connector or the solder joint may be configured as is well known to those skilled in the art.

Figure 3:
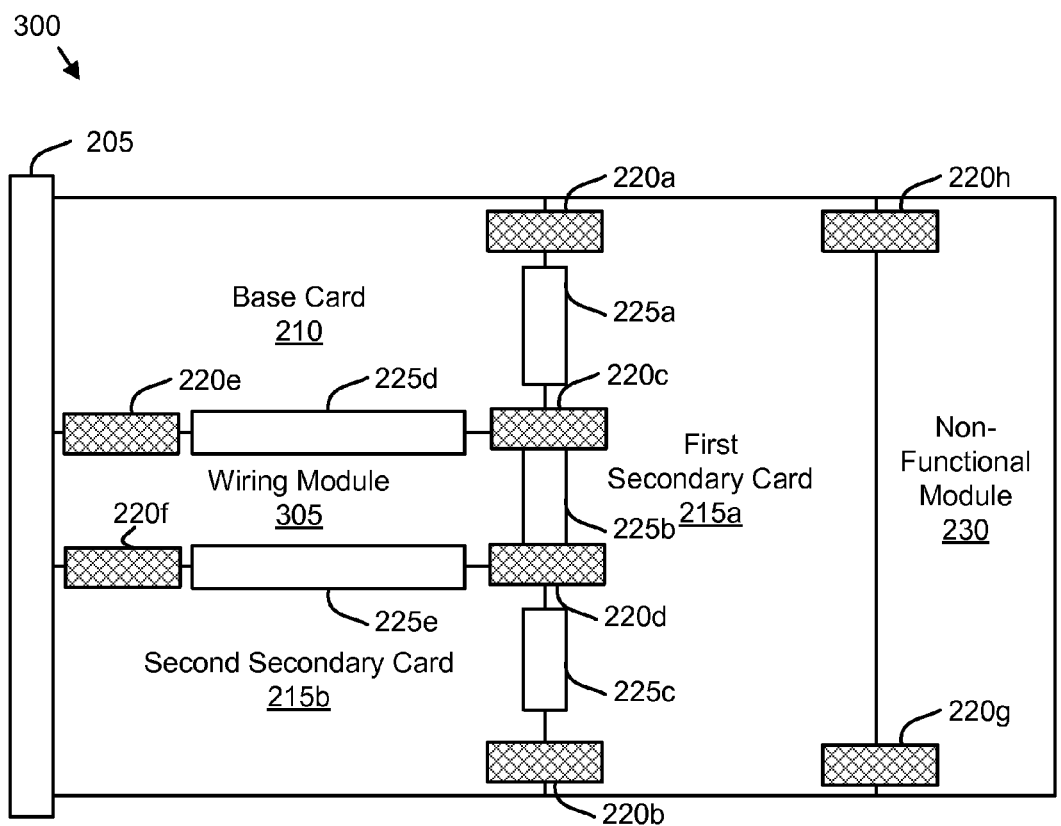
FIG. 3 is a schematic block diagram illustrating one alternate embodiment of a blade card of the present invention.

FIG. 3 is a schematic block diagram illustrating one alternate embodiment of a blade card 300 of the present invention. The blade card 300 may be embodied in the blade system 100 of FIG. 1. The description of the blade card 300 refers to elements of FIGS. 1-2, like numbers referring to like elements. The blade card 300 includes a blade connector 205, a base card 210, a plurality of secondary cards 215a-b, a plurality of couplers 220a-h, a plurality of pin connectors 225a-e, a wiring module 305, and a non functional module 230. Although, for simplicity, the blade card 300 is shown with one (1) blade connector 205, one (1) base card 210, two (2) secondary cards 215a-b, eight (8) couplers 220a-h, five (5) pin connectors 225a-e, one (1) wiring module 305, and one (1) non functional module 230, any number of those may be employed in the blade card 300.

The blade connector 205, base card 210, secondary cards 215a-b, couplers 220a-h, and pin connectors 225a-e may be the blade connector 205, base card 210, secondary card 215, coupler 220, and pin connector 225 of the blade card 200 of FIG. 2.

The blade card 300 may comprise a plurality of secondary cards 215a-b. For example, in the shown embodiment, the blade card 300 may comprise the first secondary card 215a configured as the forty gigabit (40 Gb) hard disk and a storage controller and the second secondary card 215b configured as the ten gigabit (10 Gb) Ethernet Expansion card. The blade card 300 may be manufactured to support the plurality of pin connectors 225a-e and the plurality of couplers 220a-h.

The blade card 300 may further comprise a wiring module 305 in physical and electrical communication with the base card 210 and the at least one secondary card 215a-b, wherein the wiring module 305 routes electrical communication between the base card 210 and the at least one secondary card 215a-b. The wiring module 305 may be designed specifically for supporting wiring distribution that may route electrical communication between the base card 210, the first secondary card 215a, the second secondary card 215b and/or through the blade enclosure 115.

In an embodiment, at least one electrical connection is implemented using individual wires. For example, at least one electrical connection between the processor and the hard disk may be through a ribbon connector as is well known to those skilled in the art.

The blade card 300 may further comprise the non-functional module 230 in physical communication with the blade card 300. The non-functional module 230 may be in physical communication with the blade card 200, 300 that may provide compatibility with the blade form factor and blade enclosure slot. The non-functional module 230 may be configured as one or more blank circuit cards, a plastic plane, or the like.

Figure 4:
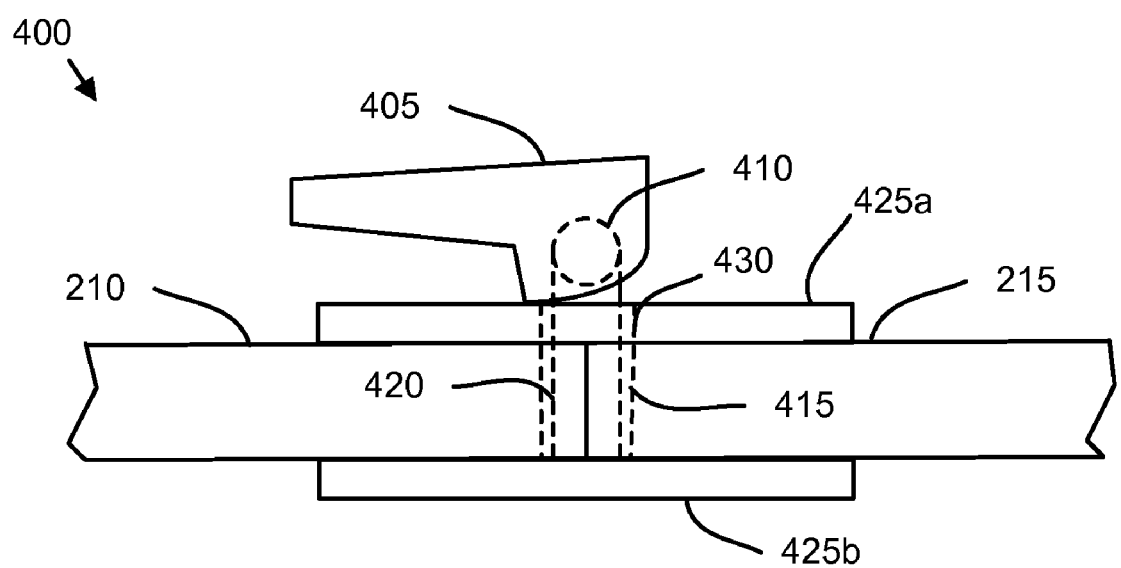
FIG. 4 is a schematic block diagram illustrating one embodiment of a side view of a coupler configured as a clamp of the present invention.

FIG. 4 is a schematic block diagram illustrating one embodiment of a side view of a coupler 400 configured as a clamp of the present invention. The coupler 400 may be embodied in the blade cards 200 and 300 of FIGS. 2 and 3 respectively. The description of the coupler 400 refers to elements of FIGS. 1-3, like numbers referring to like elements. The coupler 400 is configured to clamp the base card 210 to the secondary card 215. The coupler 400 includes a handle 405, a hinge 410, a hole 415, a shaft 420, and two (2) base plates 425a-b. Although, for simplicity, the coupler 400 is shown with one (1) handle 405, one (1) hinge 410, one (1) hole 415, one (1) shaft 420, and two (2) base plates 425a-b, any number of those may be employed in the coupler 400. The coupler 220 of FIGS. 2, 3 may be configured as coupler 400 of FIG. 4.

The coupler 400 is configured to clamp the base card 210 and the secondary card 215 together. The administrator may move the handle 405 down along with the hinge 410 to apply a tangential force to the base card 210 and the secondary card 215 that holds the base card 210 and secondary card 215 together. The shaft 420 may pass through a hole 430 in the first base plate 425a and the hole 415 in the base card 210 and the secondary card 215. The hole 415 may comprise a half hole on both the base card 210 and the secondary card 215. The shaft 420 may connect to the second base plate 425b.

The handle 405 forces the first base plate 425a toward the second base plate 425b, clamping the base card 210 and the secondary card 215 together. Lifting the handle 405 may reduce the clamping force, allowing the base card 210 and the secondary card 215 to be separated.

Figure 5:
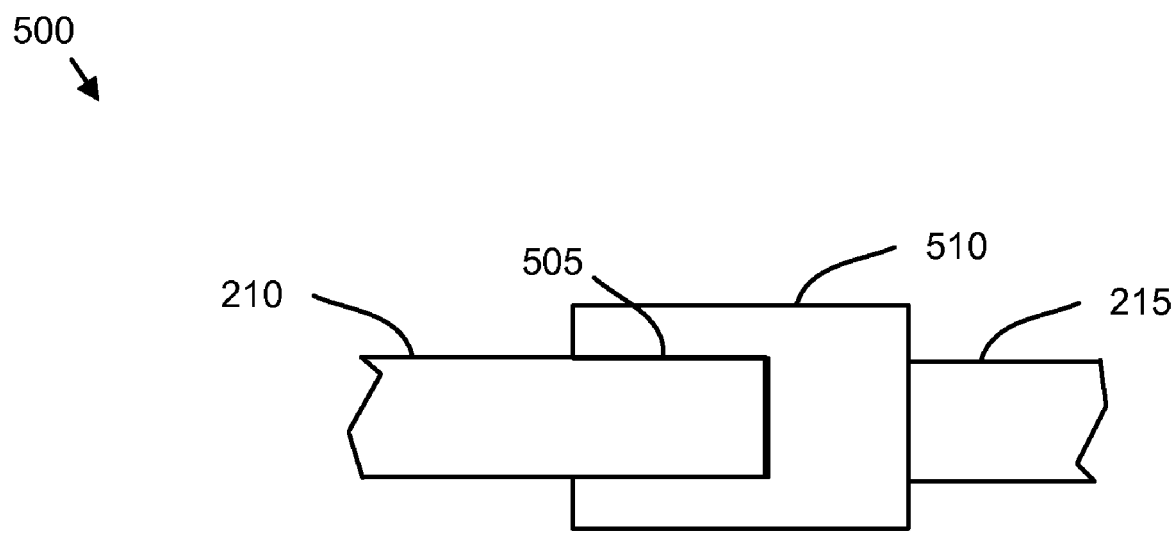
FIG. 5 is a schematic block diagram illustrating one embodiment of a top view of a coupler configured as a notch and flange of the present invention.

FIG. 5 is a schematic block diagram illustrating one embodiment of a top view of a coupler 500 configured as a notch and flange of the present invention. The coupler 500 may be embodied in the blade cards 200 and 300 of FIGS. 2 and 3 respectively. The description of the coupler 500 refers to elements of FIGS. 1-4, like numbers referring to like elements. The coupler 500 configured as a notch and flange to physically couple the base card 210 and the secondary card 215 includes a notch 505 and a flange 510. The notch 505 is shown as an edge of the base card 210. Although, for simplicity, the coupler 500 is shown with one (1) notch 505 and one (1) flange 510, any number of those may be employed in the coupler 500. The coupler 220 of FIGS. 2, 3 may be configured as coupler 500 of FIG. 5.

The flange 510 may be a projecting rim, lip, or the like of a suitable material such as metal, plastic or the like. The flange 510 may hold and strengthen the base card 210 and the secondary card 215 together. The flange 510 may have a slot of the size of the base card 210 and the secondary card 215 in center. The edges of the created slot may be configured as notch 505 as is well known to those skilled in the art.

The shorter cut on the flange 510 may then be folded along with the shorter cut in such a fashion to create an indentation or incision on an edge or surface that one or more of newly created faces are substantially at right angle to each other. The administrator may fix the blade card 200, 300 in a created space.

The notch 505 may then be flattened on the surface of the blade card 200, 300. The flattened notch 505 may then be soldered or screwed on the body of the blade card 200, 300.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 6:
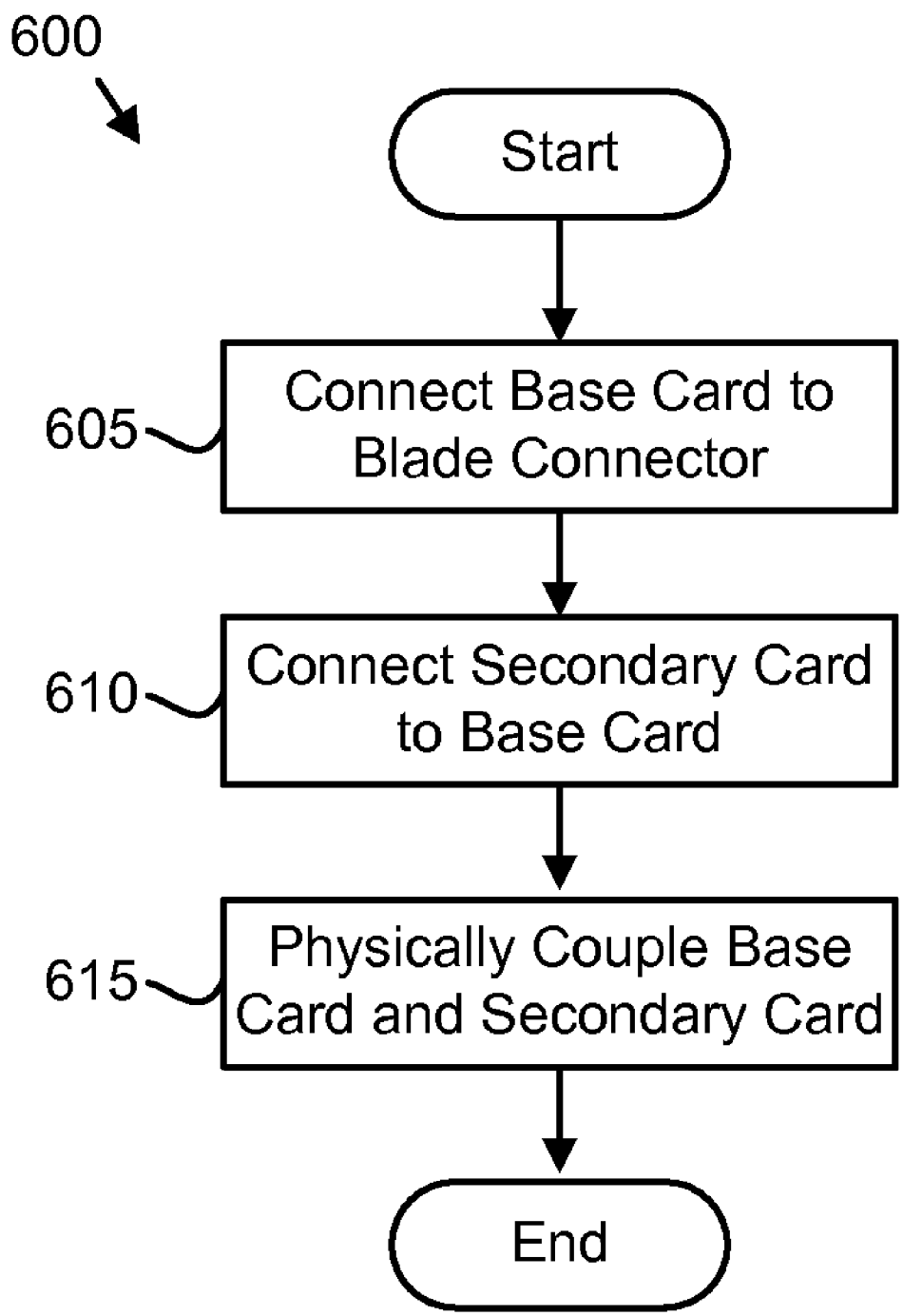
FIG. 6 is a schematic flow chart diagram illustrating one embodiment of a blade card configuration method of the present invention.

FIG. 6 is a schematic flow chart illustrating one embodiment of a blade card configuration method 600. The method 600 substantially includes the steps to carry out the functions presented above with respect to the operation of described system 100 of FIG. 1 and blade cards 200 and 300 of FIGS. 2-3 embodying one or more couplers 400, 500 of FIGS. 4-5. The description of method 600 refers to elements of FIGS. 1-5, like numbers referring to the like elements.

The method 600 starts and in an embodiment, the base card 210 connects 605 to the blade connector 205. For example, the administrator may connect 605 the base card 210 configured as the ITANIUM® processor to the blade connector 205 configured as the GbX® signal connector using the ribbon connector. The base card 210 is in physical and electrical communication with the blade connector 205 and the blade connector 205 is in physical and electrical communication with the blade enclosure connector 105. The blade card, base card, blade connector, and secondary card may be the blade card 200, 300, base card 210, blade connector 205, and secondary card 215 of FIGS. 2-3.

The secondary card 215 connects 610 with the base card 210 to form a blade card 200, 300. For example, the administrator may connect 610 the secondary card 215 configured as the hard disk with the base card 210 configured as the ITANIUM® processor using the pin connector 225 to form a blade card 200, 300. The secondary card 215 is in physical and electrical communication with the base card 210. The base card 210 and the secondary card 215 are co-planar and compatible with the blade card form factor.

The coupler 220 physically couples 615 the base card 210 and the secondary card 215. The coupler 220 may be configured as the clamp 400 of FIG. 4. Alternatively, the coupler 220 may be configured as the notch 505 and flange 510 of FIG. 5.

Thus the method 600 would allow configuring the blade card 200, 300. In a particular example, the blade card 200, 300 may be configured as a storage blade card that may include a storage controller and two or more hard disks. In one more example, the blade card 200, 300 may be configured as a "half-blade" design that may include only one (1) single processor and one (1) hard disk.

The present invention provides an apparatus, a system, and a method for a configurable blade card. Beneficially, such an apparatus, a system, and a method would configure the blade card. The configured blade card may provide a wide variety of less expensive blade server card configurations that may be used to provide data processing services. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A configurable blade card, the blade card comprising:
    a blade connector in physical and electrical communication with a blade enclosure connector;
    a base card in physical and electrical communication with the blade connector;
    a secondary card in physical and electrical communication with the base card to form the blade card, wherein the base card and the secondary card are co-planar and compatible with a blade card form factor;
    a coupler that physically couples the base card and the secondary card; and
    a non-functional blank circuit card in physical communication with the secondary card and providing compatibility with a blade enclosure slot.

2. The blade card of claim 1, wherein the base card and the secondary card collectively comprise at least one processor, at least one storage device, and at least one input/output (I/O) device.

3. The blade card of claim 1, wherein the base card and the secondary card are configured as a blade server.

4. The blade card of claim 1, wherein a secondary card is in physical and electrical communication with the blade connector.

5. The blade card of claim 1, further comprising a plurality of secondary cards.

6. The blade card of claim 3, wherein the coupler is a clamp comprising a handle, a hinge, a hole, a shaft, and a first and second base plate, the first base plate on a first side of the base card and the secondary card and the second base plate on a second side of the base card and the secondary card, the hole comprising a half hole in the base card and a half hole in the secondary card, the shaft passing through the first base plate and the hole and connecting to the second base plate, the handle connecting to the shaft at the hinge and communicating with the first base plate along an arced surface, wherein applying a downward force on the handle applies a force to the first base plate and second base plate holding the base card and secondary card together.

7. The blade card of claim 6 further comprising a wiring module in physical and electrical communication with the base card and the at least one secondary card, wherein the wiring module routes electrical communication between the base card and the at least one secondary card.

8. The blade card of claim 7, wherein at least one electrical connection is implemented using individual wires.

9. The blade card of claim 1, wherein the coupler electrically connects the base card and the secondary card.

10. A blade card configuration method, the method comprising:
    connecting a base card to a blade connector, the base card in physical and electrical communication with the blade connector and the blade connector in physical and electrical communication with a blade enclosure connector;
    connecting a secondary card in physical and electrical communication with the base card to form a blade card, wherein the base card and the secondary card are co-planar and compatible with a blade card form factor;
    physically coupling the base card and the secondary card; and
    physically coupling a non-functional blank circuit card with the secondary card, the blank circuit card providing compatibility with the blade enclosure slot.

11. A system to configure a blade card, the system comprising:
    a blade enclosure configured to receive blade cards compatible with a blade card form factor and comprising a plurality of blade enclosure connectors;
    a blade connector in physical and electrical communication with a first blade enclosure connector;
    a base card in physical and electrical communication with the blade connector;
    a secondary card in physical and electrical communication with the base card to form the blade card, wherein the base card and the secondary card are co-planar and compatible with the blade card form factor;
a coupler that physically couples the base card and the secondary card; and
a non-functional blank circuit card in physical communication with the secondary card and providing compatibility with a blade enclosure slot.

12. The system of claim 11, wherein the base card and secondary card collectively comprise at least one processor, at least one storage device, and at least one I/O device.

13. The system of claim 11, wherein the base card and secondary card are configured as a blade server.

14. An apparatus to configure a blade card, the apparatus comprising:
means for connecting a base card to a blade connector, the base card in physical and electrical communication with the blade connector and the blade connector in physical and electrical communication with a blade enclosure connector;
means for connecting a secondary card in physical and electrical communication with the base card to form the blade card configured as a server, wherein the base card and the secondary card are co-planar and compatible with a blade card form factor;
means for physically coupling the base card and the secondary card; and
means for physically coupling a non-functional blank circuit card with the secondary card, the blank circuit card providing compatibility with a blade enclosure slot.

15. The method of claim 10, wherein the base card and the secondary card are configured as a blade server and the base card and the secondary card are physically coupled with a clamp comprising a handle, a hinge, a hole, a shaft, and a first and second base plate, the first base plate on a first side of the base card and the secondary card and the second base plate on a second side of the base card and the secondary card, the hole comprising a half hole in the base card and a half hole in the secondary card, the shaft passing through the first base plate and the hole and connecting to the second base plate, the handle connecting to the shaft at the hinge and communicating with the first base plate along an arced surface, wherein applying a downward force on the handle applies a force to the first base plate and second base plate holding the base card and secondary card together.

16. The method of claim 15, wherein the secondary card is connected to the base card though a wiring module in physical and electrical communication with the base card and the secondary card, wherein the wiring module routes electrical communication between the base card and the secondary card.

17. The system of claim 13, wherein the coupler is a clamp comprising a handle, a hinge, a hole, a shaft, and a first and second base plate, the first base plate on a first side of the base card and the secondary card and the second base plate on a second side of the base card and the secondary card, the hole comprising a half hole in the base card and a half hole in the secondary card, the shaft passing through the first base plate and the hole and connecting to the second base plate, the handle connecting to the shaft at the hinge and communicating with the first base plate along an arced surface, wherein applying a downward force on the handle applies a force to the first base plate and second base plate holding the base card and secondary card together.

18. The system of claim 17, further comprising a wiring module in physical and electrical communication with the base card and the at least one secondary card, wherein the wiring module routes electrical communication between the base card and the at least one secondary card.

19. The apparatus of claim 14, wherein the base card and the secondary card are configured as a blade server and the means for physically coupling the base card and the secondary card is a clamp comprising a handle, a hinge, a hole, a shaft, and a first and second base plate, the first base plate on a first side of the base card and the secondary card and the second base plate on a second side of the base card and the secondary card, the hole comprising a half hole in the base card and a half hole in the secondary card, the shaft passing through the first base plate and the hole and connecting to the second base plate, the handle connecting to the shaft at the hinge and communicating with the first base plate along an arced surface, wherein applying a downward force on the handle applies a force to the first base plate and second base plate holding the base card and secondary card together.

20. The apparatus of claim 19, wherein the means for connecting the secondary card to the base card comprises a wiring module in physical and electrical communication with the base card and the secondary card, wherein the wiring module routes electrical communication between the base card and the secondary card.

* * * * *